United States Patent
Yi

(10) Patent No.: US 9,703,160 B2
(45) Date of Patent: Jul. 11, 2017

(54) LIQUID CRYSTAL DISPLAY PANEL WITH HOT PIXEL BEING REPAIRED AND METHOD FOR REPAIRING HOT PIXEL

(71) Applicant: Shenzhen China Star Optoelectronics Technology Co., Ltd., Shenzhen, Guangdong (CN)

(72) Inventor: Zhiguang Yi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 138 days.

(21) Appl. No.: 14/780,049

(22) PCT Filed: May 21, 2015

(86) PCT No.: PCT/CN2015/079514
§ 371 (c)(1),
(2) Date: Sep. 25, 2015

(87) PCT Pub. No.: WO2016/169080
PCT Pub. Date: Oct. 27, 2016

(65) Prior Publication Data
US 2017/0139295 A1    May 18, 2017

(30) Foreign Application Priority Data
Apr. 23, 2015    (CN) .......................... 2015 1 0198399

(51) Int. Cl.
*H01L 21/00* (2006.01)
*G02F 1/1362* (2006.01)
*H01L 27/12* (2006.01)

(52) U.S. Cl.
CPC .... *G02F 1/136259* (2013.01); *G02F 1/13624* (2013.01); *G02F 1/136286* (2013.01); *H01L 27/124* (2013.01); *G02F 2001/136263* (2013.01)

(58) Field of Classification Search
None
See application file for complete search history.

(56) References Cited

U.S. PATENT DOCUMENTS

2005/0018100 A1*  1/2005  Chen ...................... G02F 1/1309
                                                        349/54
2009/0051844 A1*  2/2009  Chen ...................... G09G 3/006
                                                        349/54

(Continued)

*Primary Examiner* — Angel Roman
(74) *Attorney, Agent, or Firm* — Andrew C. Cheng

(57) ABSTRACT

The invention discloses a liquid crystal display panel with a hot pixel being repaired and a method for repairing a hot pixel. The liquid crystal display panel includes an array substrate, the array substrate at least includes a pixel after being repaired. The pixel includes: a main pixel unit and a sub pixel unit, which receive data signals driven by a first scan line so as to have the same voltage; a charge-share unit. The sub pixel unit includes hot pixels, in the sub pixel after being repaired, a drain electrode of the thin film transistor is disconnected from an antenna, the antenna is disconnected from the sub pixel electrode, the antenna is connected to the main pixel electrode electrically, the sub pixel electrode is connected to the common line electrically; and the charge-share unit is disconnected from the main pixel unit and the sub pixel unit.

10 Claims, 3 Drawing Sheets

(56) References Cited

U.S. PATENT DOCUMENTS

| | | | | |
|---|---|---|---|---|
| 2010/0238386 | A1* | 9/2010 | Yin | H01J 9/50 |
| | | | | 349/106 |
| 2014/0111504 | A1* | 4/2014 | Lee | G09G 3/3607 |
| | | | | 345/214 |
| 2014/0292827 | A1* | 10/2014 | Kang | G09G 3/20 |
| | | | | 345/690 |
| 2015/0227011 | A1* | 8/2015 | Zhang | G02F 1/136259 |
| | | | | 257/72 |

* cited by examiner

LIQUID CRYSTAL DISPLAY PANEL WITH HOT PIXEL BEING REPAIRED AND METHOD FOR REPAIRING HOT PIXEL

BACKGROUND

1. Technical Field

The invention relates to the field of liquid crystal display technology, and more particularly to a method for repairing a hot pixel of a liquid crystal display panel and a liquid crystal display panel with a hot pixel being repaired.

2. Description of the Related Art

A liquid crystal display (LCD) is a flat, super thin display device, which consists of a number of colored or black-and-white pixels, being placed in front of a light or a reflecting plate. Due to advantages such as low power consumption, high definition, small dimension and lightweight, the liquid crystal display is prevalent and being the mainstream of display devices. Thin film transistor (TFT) liquid crystal displays are dominant in liquid crystal displays at present, a liquid crystal display panel is a main component of a liquid crystal display.

A liquid crystal display panel can consist of a thin film transistor array substrate, a colored filter substrate and a liquid crystal layer. Numerous pixel units are arranged on the thin film transistor array substrate in the form of an array, each pixel unit at least includes a thin film transistor and a pixel electrode assembled corresponding to the thin film transistor. The thin film transistor is connected to a scan line and a data line as a switch component that starts pixel units, voltage of data signals is loaded onto the corresponding pixel electrode by drive of scanning signals to realize the display of image information. Otherwise, part of the pixel electrode can cover the scan line or a common line of a substrate, lapping part is regarded as a memory capacitance Cst, utilizing for stabilizing voltage of data signals loaded on the pixel electrodes to ensure display quality of images.

A charge-share unit is employed into a pixel of a liquid crystal display panel in order to improve the display quality at wide angle, which means the colors at side view or front view are identical. FIG. 1 is a schematic structural view of an existing charge-share unit. As shown in FIG. 1, since charge-share technique is adopted, the pixel includes a main pixel unit, a sub pixel unit and a charge-share unit. The main pixel unit includes a main pixel electrode P1 and a first thin film transistor T1, the gate electrode of the first thin film transistor T1 is connected to a first scan line S1 electrically, the source electrode of the first thin film transistor T1 is connected to a data line D electrically, the drain electrode of the first thin film transistor T1 is connected to the main pixel electrode P1 electrically; the sub pixel unit includes a sub pixel electrode P2 and a second thin film transistor T2, the gate electrode of the second thin film transistor T2 is connected to the first scan line S1 electrically, the source electrode of the second thin film transistor T2 is connected to the data line D, the drain electrode of the second thin film transistor T2 is connected to the sub pixel electrode P2 by an antenna L, the antenna L passes across the main pixel electrode P1; the charge-share unit includes a third thin film transistor T3, the gate electrode of the third thin film transistor T3 is connected to a second scan line S2 electrically, the drain electrode of the third thin film transistor T3 is connected to the sub pixel electrode P2, a first charge capacitance Ccs1 is formed between the source electrode and the main pixel electrode P1, at the same time a second charge capacitance Ccs2 is formed between the source electrode and a corresponding common line COM. The equivalent circuit diagram of the charge-share unit is as shown in FIG. 2. Cgs1 is a parasitic capacitance of the main pixel unit, Cst1 is a memory capacitance of the main pixel unit, Clc1 is a liquid crystal capacitance of the main pixel unit; Cgs2 is a parasitic capacitance of the sub pixel unit, Cst2 is a memory capacitance of the sub pixel unit, Clc2 is a liquid crystal capacitance of the sub pixel unit.

Basic principle of charge-share technology is: firstly when the first scan line S1 sends scanning signals, the source electrodes and the drain electrode of the first thin film transistor T1 and the second thin film transistor T2 are connected, resulting in voltages of the main pixel electrode P1 and the second pixel electrode P2 attain the same potential influenced by data signals sending from the data line D; then when the second scan line S2 sends scanning signals, the drain electrodes and the source electrodes of the first thin film transistor T1 and the second thin film transistor T2 are cut off, at the same time the drain electrode and the source electrode of the third thin film transistor T3 are connected, resulting in charges on the sub pixel electrode P2 transfer to the common line COM by the second charge capacitance Ccs2, which can generate difference in voltage of the sub pixel electrode P2 and the main pixel electrode P1, and the liquid crystal of the sub pixel unit and liquid crystal of the main pixel unit deflect at different angles, which can achieve multi-domain display and offset color shift at wide angle.

The process of manufacturing a liquid crystal display panel includes manufacture and transportation, the entire process can produce plenty of particles, some of the particles will be swept by washers, and some of the particles will be left on the liquid crystal display panel (array side of CF side, an array substrate or a colored film substrate), the particles remaining on the liquid crystal display panel can cause hot pixels, hot (dead) lines, dotted hot pixels and dim hot (dead) lines when a liquid crystal display panel is lit, which are all not allowed to appear on a liquid crystal display panel. Therefore, the liquid crystal display panel will be repaired by a YAG laser, which can remove the particles, or hot pixels are adjusted to be dead pixels. To assure the quality of a liquid crystal display panel and sense of eyes, hot pixels are not permitted and the necessity of adjusting hot pixels into dead pixels is without doubt.

According to the charge-share unit shown in FIG. 1, when hot pixels appear in the sub pixel unit, the conventional method of adjusting hot pixels of the sub pixel unit to dead pixels is: referring to the schematic view of FIG. 3, first cutting the connection of the drain electrode of the second thin film transistor T2 and the antenna L, and cutting the connection line of drain electrode and the source electrode of the third thin film transistor T3 (marked by x in FIG. 3), then welding the sub pixel electrode P2 and the common line COM to be a short circuit (as L0 shown in FIG. 3), which can adjust a defective sub pixel unit to a dead pixel and enhance yield rate of liquid crystal display panels. In the method, potential of the antenna L in the sub pixel unit after repairing and that of the common line COM are equivalent, and the antenna L passes across the main pixel electrode P1, which can increase the memory capacitance Cst1 of the main pixel unit.

In a pixel unit, a feed through voltage $\Delta V$ can be generated after opening and shutting a thin film transistor constantly. To be more specific, according to the main pixel unit in the previous pixel, the feed through voltage $$\Delta V = \frac{(Vgh - Vg1)Cgs1}{Cgs1 + Clc1 + Cst1},$$

where Vgh is a cut-in voltage of the first thin film transistor T1, Vg1 is a cut-off voltage of the first thin film transistor T1. FIG. 4 is an oscillogram of voltage signals received by a pixel unit, Vd in the figure is waveform of voltage driven by data signals, Vg is waveform of voltage driven by scanning signals, Vp is waveform of actual voltage signals received by the pixel electrode, Vcom is a common voltage signal. As shown in FIG. 4, as the existence of the feed through voltage ΔV, a voltage Vp of a fully charged pixel electrode is less than that of the driving voltage Vd in circumstances of no matter positive half period or negative half period of the data signals driving voltage Vd, and the different value is exact ΔV, and absolute values of different value of Vp and Vcom in the positive half period and that in the negative half period are the same. Therefore, to the main pixel unit, when the memory capacitance Cst1 increases, ΔV decreases according to the formula of ΔV above, when the common voltage Vcom maintains, the different value of Vp and Vcom increases (images are dim but frequency is high, dim light is hardly perceived) in the positive half period of data signal driving voltage Vd; the different value of Vp and Vcom decreases (images are bright) in the negative half period of data signal driving voltage Vd. The final appearance will be a subtle light spot. Therefore, after repairing the sub pixel unit, the influence on the memory capacitance Cst1 of the main pixel unit should be avoided.

SUMMARY

Referring to the shortcoming of conventional technique, the invention provides a method for repairing a hot pixel of a liquid crystal display panel and a liquid crystal display panel with a hot pixel being repaired, after repairing the sub pixel unit of a charge-share unit, the memory capacitance of the main pixel unit retains the same, which can avoid influencing the feed through voltage of the main pixel unit and ensure the quality of images of a liquid crystal display panel.

To achieve the goal above, the invention employs the following technical proposal:

A liquid crystal display panel with a hot pixel being repaired includes an array substrate, the array substrate includes at least one pixel that is repaired, the pixel includes:

a data line;

a first scan line and a second scan line;

a common line;

a main pixel unit and a sub pixel unit, which are driven by scanning signals of the first scan line and receive date signals from data lines respectively, resulting in owning the same voltage; the main pixel unit at least includes a main pixel electrode, the sub pixel unit at least includes a sub pixel electrode and a second thin film transistor, a drain electrode of the second thin film transistor is connected to the sub pixel electrode by an antenna, the antenna passes across the main pixel electrode;

a charge-share unit, which is driven by scanning signals of the second scan line and changes the voltage of the sub pixel unit, making it different from the main pixel unit in voltage;

the sub pixel unit is a pixel unit with dead pixels after hot pixels being repaired, in the sub pixel unit after being repaired to be dead pixels, the drain electrode of the second thin film transistor and the antenna are disconnected, the antenna and the sub pixel electrode are disconnected, the antenna is connected to the main pixel electrode electrically, the sub pixel electrode is connected to the common line electrically; and the charge-share unit is disconnected from the main pixel unit and the sub pixel unit respectively.

The disconnection is insulation of the two components by cutting.

The antenna is connected to the main pixel electrode electrically by a first repairing wire, the sub pixel electrode is connected to the common line electrically by a second repairing wire.

The main pixel unit also includes a first thin film transistor, the gate electrode of the first thin film transistor is connected to the first scan line electrically, the source electrode of the first thin film transistor is connected to the data line electrically, the drain electrode of the first thin film transistor is connected to the main pixel electrode electrically.

The gate electrode of the second thin film transistor is connected to the first scan line electrically, the source electrode of the second thin film transistor is connected to the data line.

The charge-share unit includes a third thin film transistor, after repairing the sub pixel unit, the drain electrode of the third thin film transistor and the sub pixel electrode are disconnected, and the source electrode of the third thin film transistor is disconnected from the main pixel electrode and the common line respectively.

A method for repairing a hot pixel of a liquid crystal display panel includes sequences: disconnecting and insulating the drain electrode of the second thin film transistor and the antenna, the antenna and the sub pixel electrode, the charge-share unit and the main pixel unit as well as the sub pixel unit by laser cutting; connecting the antenna and the main pixel electrode, the sub pixel electrode and the common line electrically by laser welding.

The antenna is connected to the main pixel electrode electrically and the sub pixel electrode is connected to the common line electrically by laser welding repairing wire.

Compared with conventional technique, according to the method for repairing a hot pixel of a liquid crystal display panel provided by exemplary embodiments of the invention, when repairing the sub pixel unit of the charge-share unit, two edges of antenna passing across the main pixel electrode are disconnected and insulated, and the antenna is connected to the main pixel electrode electrically. In the liquid crystal display panel after being repaired by the method, no memory capacitance will be formed between the antenna and the main pixel electrode, the memory capacitance of the main pixel unit will not be enlarged, which can avoid influencing the feed through voltage of the main pixel unit and ensure the quality of images of a liquid crystal display panel.

DETAILED DESCRIPTION

For further description of the goal, the proposal and the result of the invention, a schematic structural view and an equivalent circuit diagram of a 2G1D pixel (in the pixel, a pixel unit is connected to two scan lines and a data line electrically) on an array substrate of a thin film transistor of a large-sized liquid crystal display panel of conventional technique are referred to illustrate the principle, execution and better result compared with conventional technique of the method of the invention in detail. One point to be noticed, the invention is explained according to the 2G1D pixel but without a certain limit. Pixel units designed by different manufacturers can be diverse, such as a 1G2D pixel (in the pixel, a pixel unit is connected to a scan line and two data lines electrically), therefore for those skilled persons in the art, various modifications and variations made according to the concept of the invention are included within the spirit and scope of the appended claims which are to be accorded with the broadest interpretation.

Figure 1:
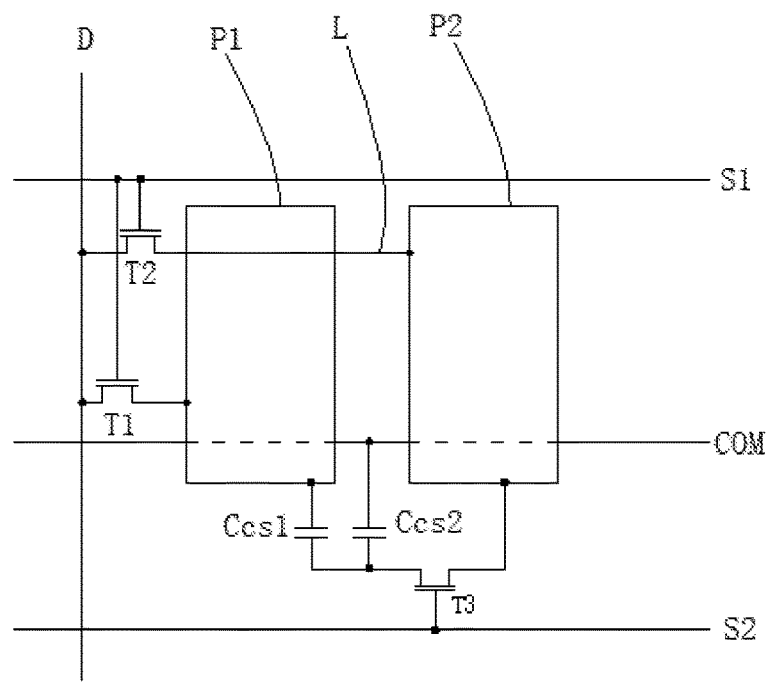
FIG. 1 is a schematic structural view of a charge-share unit.

A liquid crystal display panel according to an exemplary embodiment includes a thin film transistor array substrate, numerous charge-share units are disposed on the array substrate in the form of an array. Referring to a schematic structural view of a charge-share unit in FIG. 1 and an equivalent circuit diagram of the pixel in FIG. 2. The pixel includes a data line D, a first scan line S1, a second scan line S2, a common line COM, a main pixel unit, a sub pixel unit and a charge-share unit.

The main pixel unit and the sub pixel unit that are driven by scanning signals of the first scan line S1 and receive date signals from data line D respectively, resulting in owning the same voltage. Specifically, the main pixel unit includes a main pixel electrode P1 and a first thin film transistor T1, the gate electrode of the first thin film transistor T1 is connected to the first scan line S1 electrically, the source electrode of the first thin film transistor T1 is connected to the data line D electrically, the drain electrode of the first thin film transistor T1 is connected to the main pixel electrode P1. The sub pixel unit includes a sub pixel electrode P2 and a second thin film transistor T2, the gate electrode of the second thin film transistor T2 is connected to the first scan line S1, the source electrode of the second thin film transistor T2 is connected to the data line D electrically, the drain electrode of the second thin film transistor T2 is connected to a sub pixel electrode P2 by an antenna L electrically, the antenna L passes across the main pixel electrode P1.

A charge-share unit driven by scanning signals of the second scan line S2 and changes the voltage of the sub pixel unit, making it different from the main pixel unit in voltage. Specifically, a charge-share unit includes a third thin film transistor T3, the gate electrode of the third thin film transistor T3 is connected to the second scan line S2 electrically, the drain electrode of the third thin film transistor T3 is connected to the sub pixel electrode P2 electrically, a first charge capacitance Ccs1 is coupled to form between the source electrode and the main pixel electrode P1, at the same time a second charge capacitance Ccs2 is coupled to form between the source electrode and the corresponding common line COM.

Figure 2:
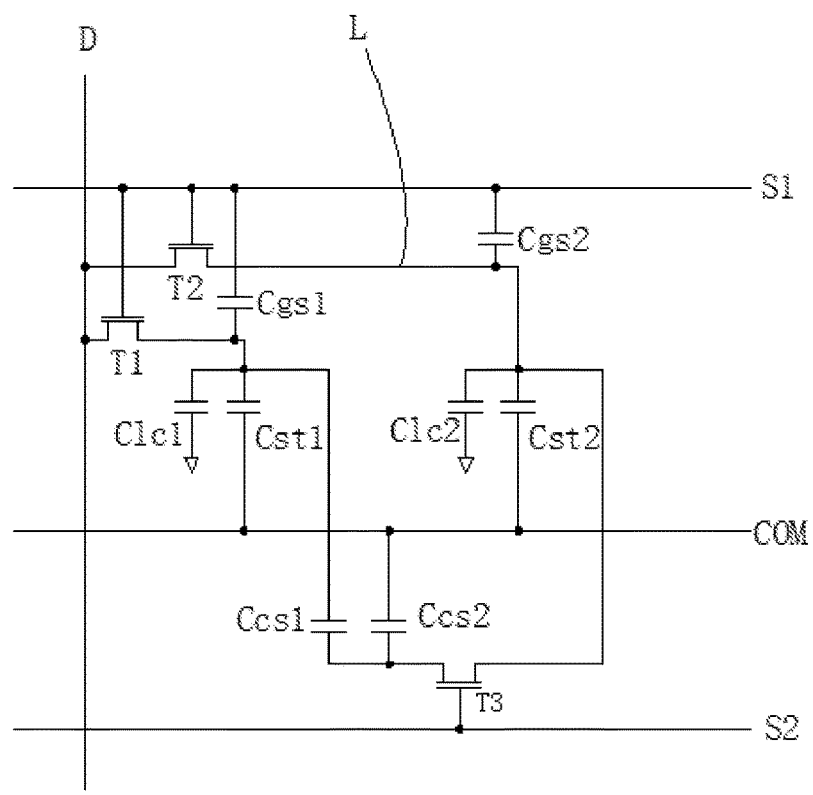
FIG. 2 is an equivalent circuit diagram of the charge-share unit of FIG. 1.
Figure 3:
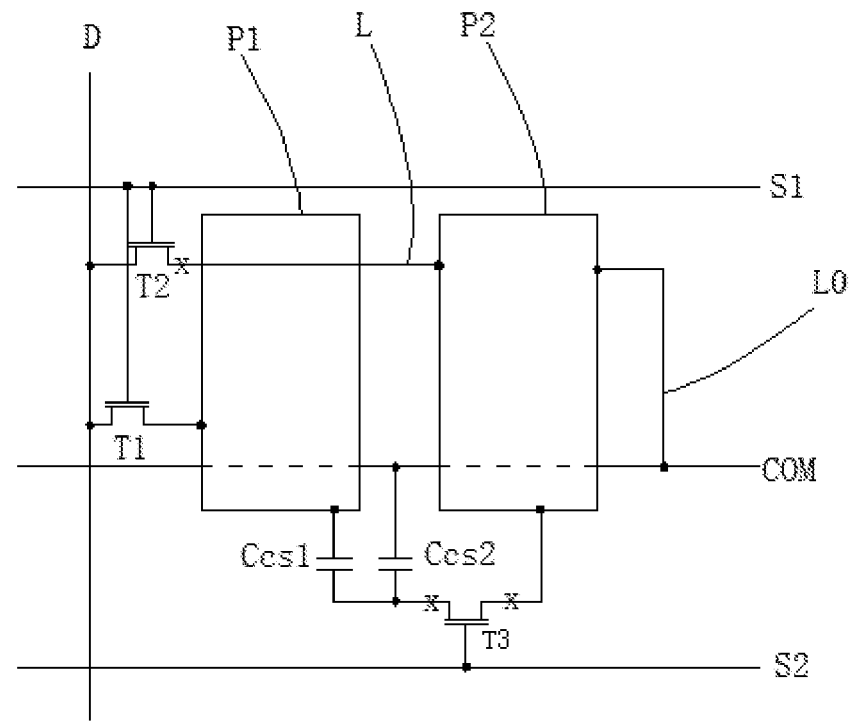
FIG. 3 is a schematic view of repairing a hot pixel in a sub pixel unit by conventional technique.
Figure 4:
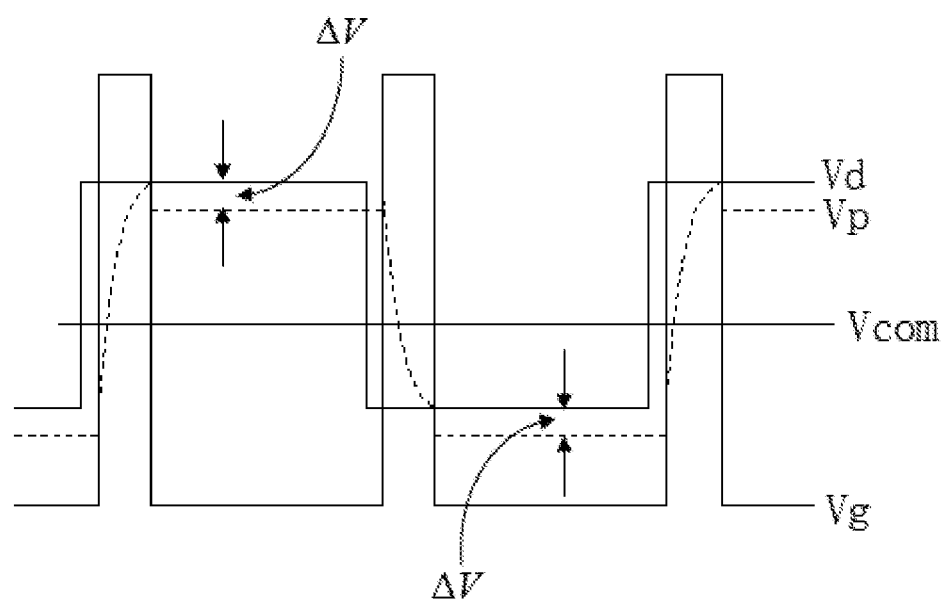
FIG. 4 is an oscillogram of voltage signals received by a pixel unit.

In the equivalent circuit diagram of FIG. 2, Cgs1 is a parasitic capacitance of the main pixel unit, Cst1 is a memory capacitance of the main pixel unit, Clc1 is a liquid crystal capacitance of the main pixel unit; Cgs2 is a parasitic capacitance of the sub pixel unit, Cst2 is a memory capacitance of the sub pixel unit, Clc2 is a liquid crystal capacitance of the sub pixel unit.

As introduced in description of the related art, the process of manufacturing a liquid crystal display panel includes manufacture and transportation, the entire process can produce plenty of particles, some of the particles will be swept by washers, and some of the particles will be left on the liquid crystal display panel (array side of CF side, an array substrate or a colored film substrate), the particles remaining on the liquid crystal display panel can cause hot pixels, hot (dead) lines, dotted hot pixels and dim hot (dead) lines when the liquid crystal display panel is lit.

When particles appear on the sub pixel unit of the charge-share unit above, a method for repairing a hot pixel is provided according to the exemplary embodiment of the invention subsequently.

Figure 5:
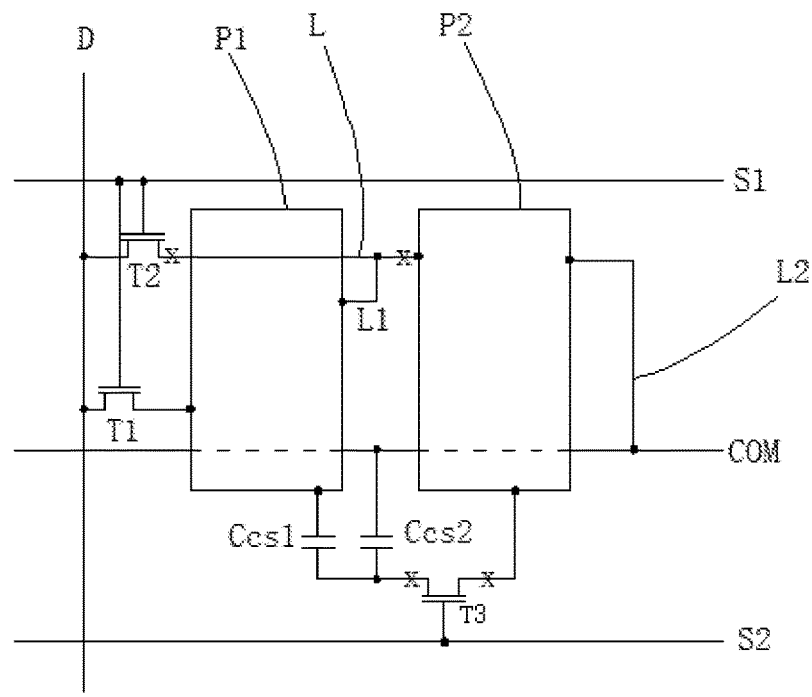
FIG. 5 is a schematic view of repairing a hot pixel in a sub pixel unit according to an exemplary embodiment of the invention.
Figure 6:
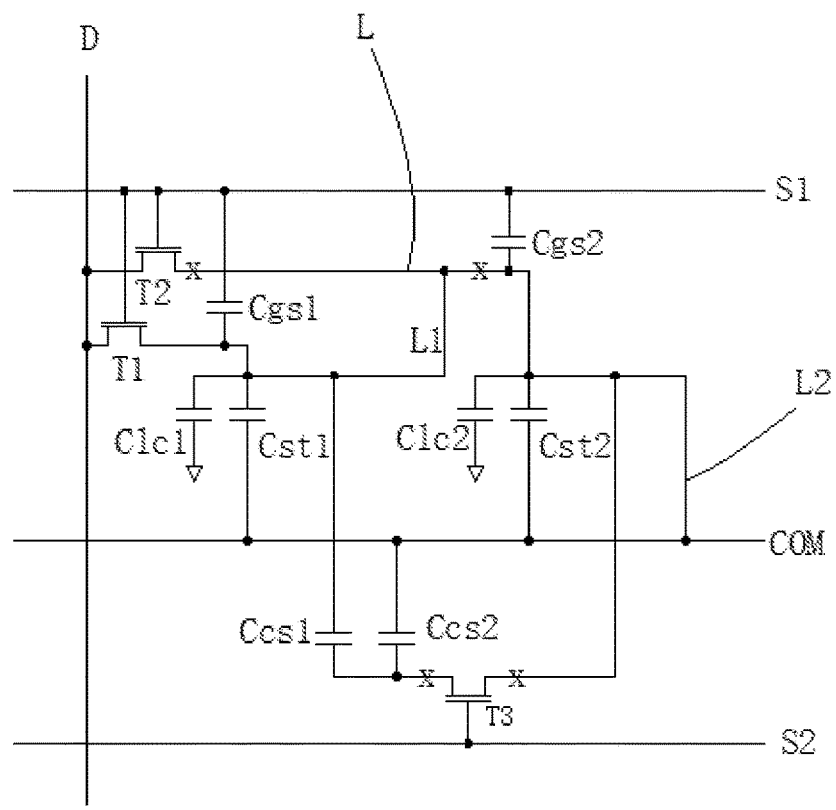
FIG. 6 is an equivalent circuit diagram of a sub pixel unit after a hot pixel being repaired according to an exemplary embodiment of the invention.

Referring to a schematic structural view of a pixel in FIG. 5 and an equivalent circuit diagram of the pixel in FIG. 6, the process includes:

1. cutting and insulating the connection of the drain electrode of the second thin film transistor T2 and the antenna L (marked by x in the Figure), cutting and insulating the antenna L and the sub pixel electrode P2 (marked by x in the Figure) by laser.

2. cutting and insulating the drain electrode and the source electrode of the third thin film transistor T3 (marked by x in Figure) by laser, which can lead to disconnection of the drain electrode of the third thin film transistor T3 and the sub pixel electrode P2, and the source electrode of the third thin film transistor T3 is disconnected from the main pixel electrode P1 and the common line COM.

3. connecting the antenna L to the main pixel electrode P1 through a first repairing wire L1 by laser welding.

4. connecting the sub pixel electrode P2 to the common line COM through a second repairing wire L2 by laser welding.

A liquid crystal display panel with a hot pixel being repaired can be achieved according to the previous method. At least one pixel in the liquid crystal display panel is repaired by the method above. Moreover, dead pixels can be formed after being repaired, but the amount of dead pixels should be kept within bounds, too many dead pixels can degrade the level of a liquid crystal display panel or disable a liquid crystal display panel.

In summary, compared with conventional technique, according to the method for repairing a hot pixel of a liquid crystal display panel in the exemplary embodiment of the invention, when repairing a hot pixel of the sub pixel unit of the charge-share unit, two edges of the antenna passing across the main pixel electrode are disconnected and insulated, and the antenna is connected to the main pixel electrode electrically. In the liquid crystal display panel after being repaired by the method, no memory capacitance will be formed between the antenna and the main pixel electrode, the memory capacitance of the main pixel unit will not be enlarged, which can avoid influencing the feed through voltage of main pixel unit and ensure the quality of images of a liquid crystal display panel.

For illustration, in the article, the term "first", "second" or the like is only used for distinguishing one motion or substance from another, not necessary limiting the claim to specific order or relationship. Further more, term "comprise", "include" or the like does not imply an exhaustion instance, which indicates all the other description such as process, method, or object are meant in their broadest reasonable sense. A sentence with the terms "comprise a" is not necessary limited the claim scope to a specific embodiment, and the reference to particularly preferred exemplary embodiments of the invention does not imply a limitation on the invention, and no such limitation is to be inferred.

The foregoing description of the preferred embodiment of the invention has been presented for purposes of illustration and description. For those skilled persons in the art, various modifications and variations can be made according to the concept of the invention, and therefore the invention needs not be limited to the disclosed embodiment.

What is claimed is:

1. A liquid crystal display panel with a hot pixel being repaired, the liquid crystal display panel comprising an array substrate, the array substrate having at least one pixel that is repaired, the pixel comprising:
   a data line;
   a first scan line and a second scan line;
   a common line;
   a main pixel unit and a sub pixel unit, which are driven by scanning signals of the first scan line to receive date signals from data lines respectively and own the same voltage; the main pixel unit at least comprising a main pixel electrode, the sub pixel unit at least comprising a sub pixel electrode and a second thin film transistor, the drain electrode of the second thin film transistor connected to the sub pixel electrode by an antenna, the antenna passing across the main pixel electrode;
   a charge-share unit, which is driven by scanning signals of the second scan line and changes the voltage of the sub pixel unit, resulting in differing from the main pixel unit in voltage;
   wherein the sub pixel unit is a pixel unit where a hot pixel is repaired to be a dead pixel, in the sub pixel unit, the drain electrode of the second thin film transistor and the antenna disconnected, the antenna and the sub pixel electrode disconnected, the antenna connected to the main pixel electrode electrically, the sub pixel electrode connected to the common line electrically; and the charge-share unit disconnected from the main pixel unit and the sub pixel unit respectively.

2. The liquid crystal display panel with a hot pixel being repaired according to claim 1, wherein the disconnection is insulation of the two components by cutting.

3. The liquid crystal display panel with a hot pixel being repaired according to claim 1, wherein the antenna is connected to the main pixel electrode electrically by a first repairing wire, the sub pixel electrode is connected to the common line electrically by a second repairing wire.

4. The liquid crystal display panel with a hot pixel being repaired according to claim 1, wherein the main pixel unit also comprises a first thin film transistor, the gate electrode of the first thin film transistor is connected to the first scan line electrically, the source electrode of the first thin film transistor is connected to the data line electrically, the drain electrode of the first thin film transistor is connected to the main pixel electrode electrically.

5. The liquid crystal display panel with a hot pixel being repaired according to claim 1, wherein the gate electrode of the second thin film transistor is connected to the first scan line electrically, the source electrode of the second thin film transistor is connected to the data line electrically.

6. The liquid crystal display panel with a hot pixel being repaired according to claim 1, wherein the charge-share unit comprises a third thin film transistor, after the hot pixel is repaired to be the dead pixel in the sub pixel, the drain electrode of the third thin film transistor and the sub pixel electrode are disconnected, and the source electrode of the third thin film transistor is disconnected from the main pixel electrode and the common line respectively.

7. A method for repairing a hot pixel of a liquid crystal display panel, the liquid crystal display panel comprising an array substrate, the array substrate at least having a pixel that is repaired, the pixel comprising:
   a data line;
   a first scan line and a second scan line;
   a common line;
   a main pixel unit and a sub pixel unit, which are driven by scanning signals of the first scan line to receive date signals from the data line respectively and own the same voltage; the main pixel unit at least comprising a main pixel electrode, the sub pixel unit at least comprising a sub pixel electrode and a second thin film transistor, the drain electrode of the second thin film transistor connected to the sub pixel electrode by an antenna, the antenna passing across the main pixel electrode;
   a charge-share unit, which is driven by scanning signals of the second scan line and changes the voltage of the sub pixel unit, resulting in differing from the main pixel unit in voltage;
   wherein the sub pixel is a pixel where the hot pixel is repaired to be a dead pixel, and the method for repairing a hot pixel comprises:
   disconnecting and insulating the drain electrode of the second thin film transistor and the antenna, the antenna and the sub pixel electrode, the charge-share unit and the main pixel unit as well as the sub pixel unit by laser cutting;
   connecting the antenna to the main pixel electrode electrically and connecting the sub pixel electrode to the common line electrically by laser welding.

8. The method for repairing a hot pixel of a liquid crystal display panel according to claim 7, wherein the antenna is connected to the main pixel electrode electrically and the sub pixel electrode is connected to the common line electrically by laser welding repairing wire.

9. The method for repairing a hot pixel of a liquid crystal display panel according to claim 7, wherein the charge-share unit comprises a third thin film transistor, the drain electrode of the third thin film transistor is disconnected and insulated from the sub pixel electrode, the source electrode of the third thin film transistor is disconnected and insulated from the main pixel electrode and the common line respectively by laser cutting.

10. The method for repairing a hot pixel of a liquid crystal display panel according to claim 7, wherein the main pixel unit also comprises a first thin film transistor, the gate electrode of the first thin film transistor is connected to the first scan line electrically, the source electrode is connected to the data line electrically, the drain electrode is connected to the main pixel electrode electrically.

* * * * *